United States Patent [19]

Bryant et al.

[11] Patent Number: 4,608,567
[45] Date of Patent: Aug. 26, 1986

[54] FAST ENVELOPE DETECTOR WITH BIAS COMPENSATION

[75] Inventors: Steve M. Bryant, Baltimore; Lanier G. Cole, Crofton, both of Md.

[73] Assignee: The United States of America as represented by the Secretary of the Air Force, Washington, D.C.

[21] Appl. No.: 623,581

[22] Filed: Jun. 22, 1984

[51] Int. Cl.⁴ .............................................. H03D 1/06
[52] U.S. Cl. .................................... 343/7 A; 329/179
[58] Field of Search ............ 343/5 DP, 5 NQ, 5 VQ, 343/7 AG, 7 A, 5 CF; 329/145, 178, 179; 375/76, 98, 102; 455/336, 337; 307/351, 352, 264, 296 R

[56] References Cited

U.S. PATENT DOCUMENTS

| | | | |
|---|---|---|---|
| 3,599,208 | 8/1971 | Nelson | 343/7 A |
| 3,829,671 | 8/1974 | Gathright et al. | 235/158 |
| 3,858,036 | 12/1974 | Lunsford | 235/158 |
| 3,879,664 | 4/1975 | Monsen | 375/98 |
| 4,093,948 | 6/1978 | Long, III | 343/7 A |
| 4,168,500 | 9/1979 | Brassaw | 343/7.7 |
| 4,168,501 | 9/1979 | Brassaw | 343/7.7 |
| 4,231,005 | 10/1980 | Taylor, Jr. | 343/5 NQ |
| 4,293,856 | 10/1981 | Chressanthis et al. | 343/5 CF |
| 4,298,942 | 11/1981 | Lee | 364/483 |

FOREIGN PATENT DOCUMENTS 2503897  4/1981  France .............................. 343/5 NQ

OTHER PUBLICATIONS

Webster's New Ninth Collegiate Dictionary, p. 70; Merriam-Webster, 1983; Springfield, Mass.

Primary Examiner—Thomas H. Tarcza
Assistant Examiner—Bernarr Earl Gregory
Attorney, Agent, or Firm—Donald J. Singer; Willard R. Matthews

[57] ABSTRACT

In combination with an envelope detector in a radar system, a bias compensation circuit consisting of a programmable read-only memory and a binary adder produce an unbiased envelope detection signal. The bias compensation circuit adds one to the output of the detector based upon whether the minimum of the I and Q (inphase and quadrature) signals is odd and the maximum even. It is capable of compensating for both normal envelope detection and the multiple divide-by-two case. As a result the dynamic range of the radar can be increased without the necessity for extensive additional hardware.

5 Claims, 1 Drawing Figure

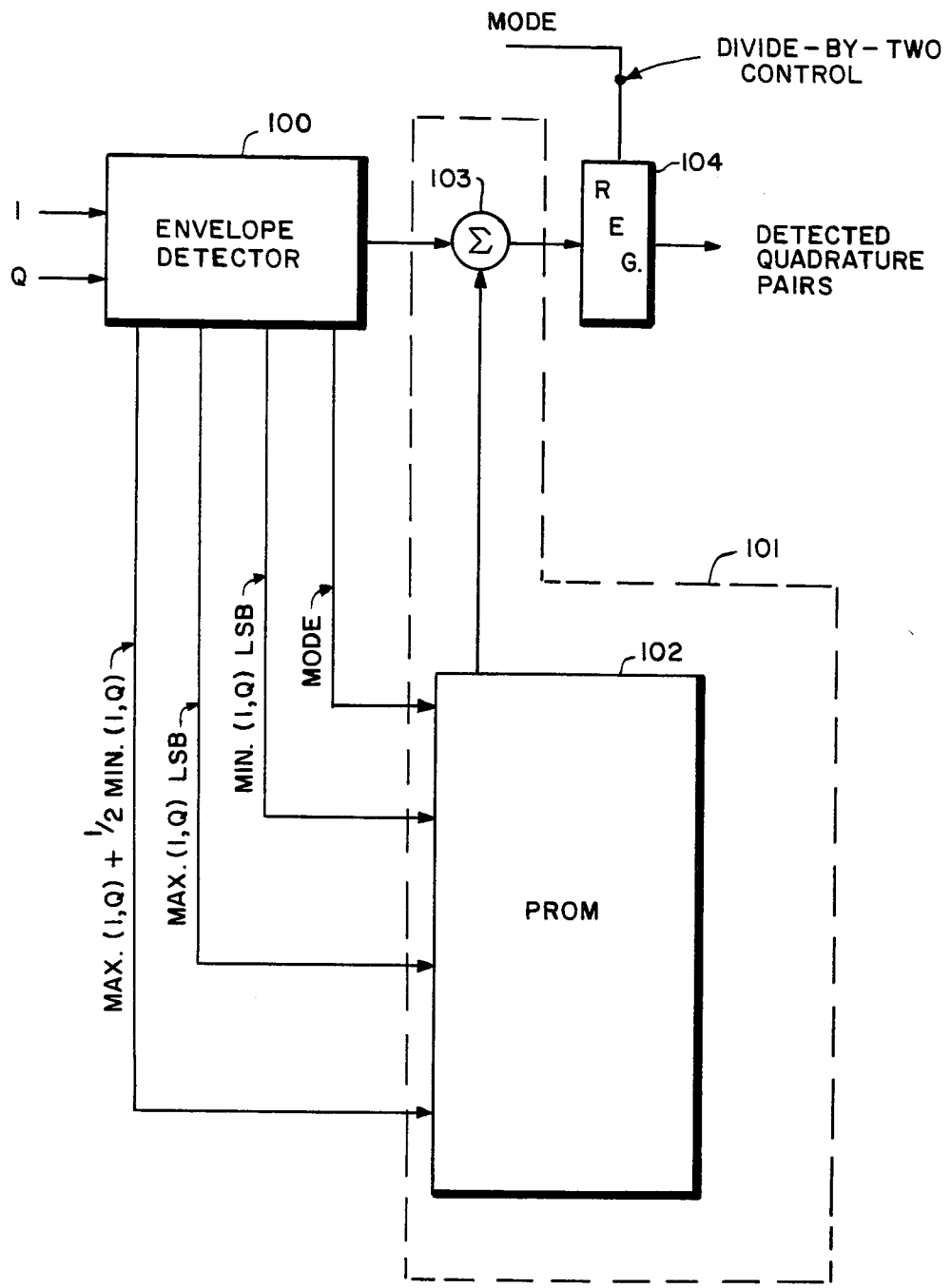

FAST ENVELOPE DETECTOR WITH BIAS COMPENSATION

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to radar receivers and specifically to an envelope detector.

The portion of the radar receiver that extracts the modulation from the carrier is the detector. One particular type of detector is the envelope detector which recognizes the presence of the desired signal on the basis of the amplitude of the carrier envelope. The radar receivers derive the in-phase (I) and quadrature (Q) components of the received echo signals which is used in the envelope detection function.

Modern radar systems operate at certain signal-to-noise ratios in order to achieve a specified probability of detection without exceeding a specified probability of false alarm. High false alarm rate in the detection process can result if the noise level is lowered to achieve greater dynamic range, due to the bias added by the output of the envelope detector.

The task of improving the envelope detection function is alleviated, to some degree, by the prior art techniques given in the following patents: which are incorporated herein by reference U.S. Pat. No. 4,298,942 issued to Lee on Nov. 3, 1981;
U S. Pat. No. 3,599,208 issued to Nelson on Aug. 10, 1971;
U.S. Pat. No. 4,231,005 issued to Taylor, Jr. on Oct. 28, 1980;
U.S Pat. Nos. 4,168,500 and 4,168,501 issued to Brassaw on Sept. 18, 1979;
U.S. Pat. No. 3,829,671 issued to Gathright et al on Aug. 13, 1974; and
U.S. Pat. No. 3,858,036 issued to Lunsford on Dec. 31, 1974.

Lee discloses a nonlinear amplitude detector whose output is based upon a Binomial expansion of the in-phase and quadrature signal components. The smaller signal component is squared and divided by the large magnitude signal component. In the patent the quotient from this operation is multiplied by a coefficient that is selected to provide desired amplitude error deviation characteristics. Signal amplitude is then determined by summing this product with the larger magnitude signal component.

While the Lee patent is very instructive in signal amplitude detection from the signal's inphase and quadrature components, the emphasis of Lee is reduction of the processing requirement in signal approximation. What remains required is improved error performance strictly tailored towards elimination of bias of envelope detectors while improving a radar system's dynamic range.

The remaining patents point in the correct direction of signal approximation by performing functions of I and Q pairs but, like Lee, are inappropriate for this specific engineering task. The two Brassaw patents show arrangements for averaging inphase and quadrature signals and then dividing them by a constant. In Nelson the magnitude of the quadrature error signal is used to control the gain or sensitivity of the monopulse receiver. Taylor, Jr. develops inphase and quadrature components in conjunction with a phase discrimination constant false alarm rate (CFAR) system. The Taylor, Jr. system includes a phase angle sensor for measuring the phase angle of the echo signal as one of at least eight predetermined phase angle representations with binary numbers in Gray format based on the relative magnitudes and polarities of the inphase and quadrature components of the echo signal. Both the Gathright et al and Lunsford patents are included as showing circuits for approximating the square root of the sum of I and Q squared signals in a radar.

For many years, a simple approximation has been used for performing the envelope detection function for quadrature pairs. The exact envelope detector has an output voltage given by (1).

$$E = \sqrt{I^2 + Q^2} \tag{1}$$

The approximation adds tne absolute magnitude of the larger of the quadrature pairs to one-half the absolute magnitude of the smaller. This algorithm is given in (2).

$$\begin{aligned} E &= |I| + |Q/2| \quad \text{for } |I| \geq |Q| \\ &= |Q| \quad |I/2| \quad \text{for } |Q| > |I| \end{aligned} \tag{2}$$

Analysis has shown that an ideal implementation of this approximation results in negligible (about 0.1 dB) loss in the detection process in a radar system. In the digital mechanization, however, the divide-by-two for an odd number results in an output that is 0.5 Q (Q=quanta) low. Since the quantity, either I or Q, that is divided by two has a probability of 0.5 of being odd, the average output is low by a constant 0.25 Q. The CFAR (constant false alarm rate) circuitry typically averages a number of samples on noise from the envelope detector and multiplies by a constant, K, to provide threshold for detection. If the average value of noise from the actual envelope detector is $N_a$, and the average value from the ideal approximate detector is $N_i$, then the threshold, T, is calculated as shown in (3), $$T_a = K_a \overline{N}_a K_a(\overline{N}_i - 0.25) \tag{3}$$

whereas the desired threshold for a specific false alarm rate is given in (4), $$T_i = K_i \overline{N}_i \tag{4}$$

Since the ideal and actual thresholds should be equal, the relationship between $K_a$ and $K_i$ can be derived as shown in (5), $$K_i/K_a = 1 - 0.25/\overline{N}_i \tag{5}$$

As evident from (5), the actual multiplier must be greater than the ideal multiplier and can provide a ccrrect threshold at only a single value of $\overline{N}_i$. Hence, the CFAR circuitry does not result in a constant false alarm rate when the amplitude of noise varies. As long as $\overline{N}_i$ is large, the false alarm rate does not decrease greatly when $\overline{N}_i$ increases, but increases drastically when $\overline{N}_i$ is reduced. The problem, therefore is to eliminate the 0.25 Q bias in the actual envelope detector.

In the radar system for which this invention was conceived, the envelope detector also divides the output of the detector by two so that the output of this specific envelope detector is given in (6).

$$E = \frac{|I| + |Q/2|}{2} \text{ for } |I| \geq |Q| \qquad (6)$$

$$= \frac{|Q| + |I/2|}{2} \text{ for } |Q| > |I|$$

By similar analysis, it can be shown that this mechanization increases the amount of bias in the actual envelope detector to 0.375 Q. Obviously, it is even more desireable to compensate for this bias.

In view of the foregoing discussion, it is apparent that there currently exists a need for compensating for the bias of radar receiver envelope detectors to avoid excessively high false alarm rates in the detection process when the noise level is lowered in the attempt to achieve greater dynamic range. The present invention is directed towards satisfying that need.

SUMMARY OF THE INVENTION

This invention is designed to add a bias compensation factor to the output of the envelope detector of a radar system. Without this compensation the bias can cause excessively high false alarm rates in the detection process if the noise level is lowered to achieve greater dynamic range. The bias compensation circuit comprises a programmable read-only memory (PROM) and a binary adder at the output of the envelope detector. The PROM is addressed as a function of the data passing through the detector and under the appropriate conditions, a logical one is propagated to the "carry in" input of the adder, effectively adding one in a selected manner to the detector output and providing bias compensation. The invention adds one to the output of the detector based upon whether the minimum of the I and Q (inphase and quadrature) signals is odd and the maximum even. It is capable of compensating for both normal envelope detection and the multiple divide-by-two case. As a result the dynamic range of the radar can be increased without the necessity for extensive additional hardware.

It is a principle object of the invention to provide a new and improved envelope detector system in a radar receiver.

It is another object of the invention to add a bias compensation factor to the output of the envelope detector radar system.

It is another object of the invention to provide a fast signal approximation in the envelope detection function from the inphase and quadrature signal components.

It is another object of the present invention to allow the increase of the dynamic range of a radar system without high false alarm ratio due to the bias of the envelope detector.

These together with other objects, features and advantages of the invention will become more readily apparent from the following detailed description when taken in conjunction with the accompanying drawing wherein like elements are given like reference numerals throughout.

DESCRIPTION OF THE DRAWING

The sole figure of the drawing is a block diagram illustrating an embodiment of the present invention.

DETAILED DESCRIPTION OF THE PREFERRED EMBODIMENT

This invention provides a means of adding a bias compensation factor to the output of the envelope detector of a radar system.

This bias compensation circuit comprises a programmable read-only memory (PROM) and a binary adder at the output of the envelope detector. The PROM is addressed as a function of the data passing through the detector and under the appropriate conditions, a logical one is propagated to the "carry in" input of the adder, effectively adding one in a selected manner to the detector output and providing bias compensation.

FIG. 1 is a block diagram of an envelope detector with bias compensation. The invention contains the envelope detector 100, the bias compensation circuit 101 containing the PROM 102 and the binary adder 103, and register 104.

The envelope detector 100 receives inphase (I) and quadrature (Q) components of radar echo return signal from the radar receiver. As shown in FIG. 1, the envelope detector 100 outputs four signals. They are: the mode signal; max [I,Q]; min [I,Q]; and max [I,Q] + ½ min [I,Q]. The production of each of these signals may be accomplished by systems and techniques already known in the art, and is discussed briefly below.

First, the production of the max [I,Q] as well as the min [I,Q] is common among envelope detectors. For example the Lee reference shows that a comparator in an envelope detector is commonly used to receive an I and Q signals and output the max [I,Q] and min [I,Q] signals. Another example is the French patent of Lepere et al No. 250,3897 which uses to separate comparators: one to produce max [I,Q] and another to produce min [I,Q]. Once max [I,Q] and min [I,Q] are obtained the fourth signal max [I,Q] + ½ min [I,Q] is obtainable simply by processing min [I,Q] through a divide-by-two element and summing the output with max [I,Q] using a binary adder.

Finally, the mode signal is simply an indicator of whether the detector is operating in the "normal envelope detection mode" or the "multiple divide-by-two mode". Alternatives for the mode signal are numerous and can include a digital signal which indicates a logic 1 or a logic 0.

The bias compensation circuit 101 consists of a programmable read-only memory (PROM) 102 and a binary adder 103 on the output of the detector as shown in FIG. 1. The PROM is addressed as a function of the data passing through the detector and under the appropriate conditions, described below, a logical one is propagated to the "carry in" input of the adder, effectively adding one to the detector output and providing the bias compensation.

The mechanization of the invention possessed the capability to compensate for both the normal envelope detection case (no divide-by-two at the output) and the multiple divide-by-two case (divide-by-two at the output). Each of these cases are discussed separately below.

The normal envelope detection algorithm is simply the calculation of the max[I,Q] + ½ min[I,Q] with no divide-by-two at the output. In this case, as was described in the previous section, the constant bias on the output is 0.25 Q. The error producing this bias occurs when the min [I,Q] is odd. Ideally, whenever the min [I,Q] is odd, 0.5 should be added to the result to reduce this error to zero. Since this implementation deals completely with integer representations, the addition of fractional bits to the output would not result in any compensation in that they would not be propagated to the integer part of the output. As a result, rather than adding in 0.5 half the time (when min[I,Q] is odd), the approach taken in this mechanization is the addition of one, twenty-five percent of the time, thus achieving the same compensation effect on the average (i.e. an average bias of zero). The PROM contents for this normal envelope detection case is shown below.

| PROM ADDRESS | | PROM CONTENTS |
|---|---|---|
| Min [I,Q] LSB | Max [I,Q] LSB | |
| 0 | 0 | 0 |
| 0 | 1 | 0 |
| 1 | 0 | 1 |
| 1 | 1 | 0 |

Note that the case of min[I,Q] being odd and max [I,Q] being even was selected as the instance where a one was added to the output result of the envelope detection. Any of the four cases could have been selected as they are equi-probable.

The multiple divide-by-two envelope detection algorithm is simply the calculation of the max[I,Q]+½ min-[I,Q] with a divide-by-two at the output. In this case, as was described in the previous section, the constant bias on the output is 0.375 Q. The error producing this bias occurs when the min [I,Q] is odd, the sum max [I,Q]+½ min [I,Q] is odd, or both. Ideally, as in the normal detection case, whenever either error occurred, a fractional compensation should be added to the result to reduce this error to zero. In this case of integer representation, rather than in 0.5 half the time (when sum is odd) or adding in 0.25 half the time (when min [I,Q] is odd), the approach taken in this mechanization is the addition of one, 37.5 percent of the time, thus achieving the same compensation effect on the average (i.e. an average bias of zero). The PROM contents for this multiple divide-by-two envelope detection case is shown below:

| PROM ADDRESS | | | PROM CONTENTS |
|---|---|---|---|
| Min [I,Q] LSB | Max [I,Q] LSB | Sum LSB | |
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 0 |
| 1 | 1 | 1 | 1 |

Note once again the three cases selected for the addition of the compensation term have been selected without loss of generality as all cases are equi-probable.

Returning to FIG. 1, the binary adder 103 combines the envelope detection signal from the envelope detector 100 with the bias compensation signal from the PROM 101 to produce a envelope detection signal.

Register 104 receives the envelope detection signal from the binary adder 103 and a mode indication signal from the envelope detector 100. The mode detection signal indicates whether the envelope detector is operating in the "normal envelope detection mode" or the "multiple divide-by-two envelope detection mode. Register 104 outputs detected quadrature pairs with an average bias of zero.

One way of increasing dynamic range is to adjust the gain such that the noise level is lowered, providing more dynamic range before large signals reach saturation. The bias compensation described herein provides the capability of operating at lower noise levels without having to add additional hardware to provide more dynamic range in subsequent circuitry and without causing severe false rate variations.

This invention solves this problem by adding one to the output of the detector based on whether the min [I,Q], the quantity to be divided-by-two is odd and the other quantity (max [I,Q]) is even. These are the conventions used in this mechanization of the invention, although either an odd or even convention could be used. The logic for the multiple divide-by-two is similar and is described in the detailed description of the invention. This mechanization gives an average bias of zero.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with a host radar system receiving echo return signals, an envelope detection system with bias compensation comprising:
    an envelope detector receiving said echo return signals from said host radar system in the form of inphase and quadrature signal components and producing:
    a first output signal being a biased envelope detection signal;
    a second output signal being a mode select signal;
    a third output signal indicating a minimum value of the inphase and quadrature signal component;
    a fourth output signal indicating a maximum value of said inphase and quadrature signal component;
    a fifth output signal equaling the sum of said fourth output signal plus one-half said third output signal; and
        a bias compensation means receiving said first, second, third, fourth and fifth output signals from said envelope detector and producing an unbiased detection signal.

2. An envelope detection system as defined in claim 1 wherein said bias compensation means comprises:
    a programmable read-only memory receiving said second, third, fourth and fifth output signals from said envelope detector and using a first logic algorithm to produce a bias compensation signal when said second output signal indicates a normal bias compensation is required, said programmable read-only memory using a second logic algorithm to produce said bias compensation signal when said second output signal indicates a multiple divide-by-two envelope detection compensation is required; and
    an adding means receiving said biased envelope detection signal from said envelope detector and said bias compensation signal from said programmable read-only memory and producing said unbiased detection signal.

3. An envelope detecton system as defined in claim 2 wherein said first logic algorithm comprising the steps of:
   comparing said third output signal with said fourth output signal from said envelope detector;
   producing a bias compensation signal of logical 1 when said fourth output signal is a logical 1 and said output signal is zero; and
   producing a bias compensation signal of logical 0 otherwise.

4. An envelope detection system as defined in claim 3 wherein said second logic algorithm comprises the steps of:
   comparing said third, fourth and fifth output signals from said envelope detector; and
   producing a bias compensation signal using the following logic table:

| Min [I,Q] LSB | Max [I,Q] LSB | Sum LSB | PROM OUTPUT |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 0 |
| 1 | 1 | 1 | 1 |

5. An envelope detection system as defined in claim 4 wherein said adding means comprises:
   a binary adder combining said biased envelope detection signal with said bias compensation signal to produce said unbiased detection signal.

* * * * *